(12) United States Patent
Sun et al.

(10) Patent No.: US 11,467,227 B2
(45) Date of Patent: Oct. 11, 2022

(54) INFORMATION PROCESSING METHOD AND MOBILE DEVICE

(71) Applicant: HUAWEI TECHNOLOGIES CO., LTD., Shenzhen (CN)

(72) Inventors: Duo Sun, Shenzhen (CN); Aimin Leng, Guragon (CN); Zhiyong Wang, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 664 days.

(21) Appl. No.: 16/322,479

(22) PCT Filed: Aug. 11, 2016

(86) PCT No.: PCT/CN2016/094626
§ 371 (c)(1),
(2) Date: Jan. 31, 2019

(87) PCT Pub. No.: WO2018/027798
PCT Pub. Date: Feb. 15, 2018

(65) Prior Publication Data
US 2019/0170834 A1 Jun. 6, 2019

(51) Int. Cl.
*G01R 33/032* (2006.01)
*G04G 21/02* (2010.01)
*G06F 1/16* (2006.01)
*G06F 3/01* (2006.01)
*G04C 3/00* (2006.01)
*G01C 17/02* (2006.01)

(52) U.S. Cl.
CPC .......... *G01R 33/032* (2013.01); *G01C 17/02* (2013.01); *G04C 3/004* (2013.01); *G04G 21/02* (2013.01);

(Continued)

(58) Field of Classification Search
CPC ........ G04C 3/004; G04C 17/02; G04G 21/02; G04G 21/025; G06F 1/163; G06F 1/1658;
(Continued)

(56) References Cited

U.S. PATENT DOCUMENTS 5,684,761 A * 11/1997 Chen ...................... G04C 10/00
368/64
9,999,380 B1 * 6/2018 Demas ...................... A61B 5/05
(Continued)

FOREIGN PATENT DOCUMENTS

CN 103533486 A 1/2014
CN 104007827 A 8/2014
(Continued)

*Primary Examiner* — Alvaro E Fortich
(74) *Attorney, Agent, or Firm* — Maier & Maier, PLLC

(57) ABSTRACT

The present invention disclose an information processing method and a mobile device. The mobile device includes a device body and a magnetic adjustment mechanism, where the magnetic adjustment mechanism includes a magnetic adjustment member and a magnetic sensor, and the magnetic adjustment member is adjusted to enable the magnetic sensor to generate a pulse signal; and the device body further includes a processor and a display screen, and the processor receives the pulse signal generated by the magnetic adjustment mechanism, processes the pulse signal, and then displays adjusted content by using the display screen. This avoids a problem that adjustment cannot be conveniently performed because a display screen is covered by a finger when an operation is performed directly on the display screen.

7 Claims, 16 Drawing Sheets

(52) U.S. Cl.
CPC ........... *G04G 21/025* (2013.01); *G06F 1/163* (2013.01); *G06F 1/1658* (2013.01); *G06F 1/1684* (2013.01); *G06F 3/016* (2013.01)

(58) Field of Classification Search
CPC ..... G06F 1/1684; G06F 3/016; G01R 33/032; G01R 33/07; G01R 15/207; G01D 5/145; G01D 11/245; H03K 17/97; H03K 2217/94068

See application file for complete search history.

(56) References Cited

U.S. PATENT DOCUMENTS

| | | | |
|---|---|---|---|
| 2012/0007589 A1* | 1/2012 | Okada | G01R 33/07 324/207.2 |
| 2012/0223699 A1* | 9/2012 | Holman, Jr. | G01D 5/145 324/207.2 |
| 2014/0298062 A1 | 10/2014 | Lee et al. | |
| 2016/0098016 A1* | 4/2016 | Ely | G04C 3/00 368/308 |
| 2016/0299582 A1* | 10/2016 | Wei | G01D 11/245 |
| 2016/0378069 A1 | 12/2016 | Rothkopf | |
| 2017/0168707 A1 | 6/2017 | Anzures et al. | |
| 2018/0177285 A1* | 6/2018 | MacDonald | H01F 7/0221 |

FOREIGN PATENT DOCUMENTS

| | | |
|---|---|---|
| CN | 104102288 A | 10/2014 |
| CN | 105388966 A | 3/2016 |
| CN | 205121417 U | 3/2016 |
| CN | 105518567 A | 4/2016 |
| WO | 2016106257 A1 | 6/2016 |

\* cited by examiner

INFORMATION PROCESSING METHOD AND MOBILE DEVICE

CROSS-REFERENCE TO RELATED APPLICATIONS

This application is a national stage of International Application No. PCT/CN2016/094626, filed on Aug. 11, 2016, which is hereby incorporated by reference in its entirety.

TECHNICAL FIELD

The present invention relates to the field of intelligent wearable device technologies, and in particular, to an information processing method and a mobile device.

BACKGROUND

A smartwatch is a wearable device that has an information processing capability and that meets a basic appearance/technical requirement of a watch. In addition to time indication, the smartwatch further has one or more functions of notification, navigation, calibration, monitoring, interaction, or communication. Display manners include a pointer, a number, an image, and the like, and an operation can be performed, in a manner of touching, on content displayed on a display screen. Compared with a conventional watch, the smartwatch has much more functions. Therefore, the smartwatch can replace a smartphone in many scenarios and is gradually stepping into people's daily life. One important developing direction of the smartwatch is continuously improving man-machine interaction performance.

A screen of a prior-art smartwatch is usually in a range of 1.2 to 1.4 inches, and a man-machine interaction function, such as clicking OK, paging up/down, or image zooming in/out, is implemented directly by using a touchscreen of the watch.

In the prior art, when content displayed on a display screen is operated by using a finger, false triggering is prone to occur when the finger directly touches the display screen because of factors such as a small size of the screen or a wobble in a moving state. Therefore, an operation, such as paging up/down or zooming in/out, may also be performed by using a mechanical rotary switch that is similar to a watch crown. A signal is output by rotating the rotary switch, and software in the smartwatch implements man-machine interaction based on the signal.

In a process of operating the mechanical rotary switch, a specific quantity of signals output during the rotating of the rotary switch is determined based on a brush gear inside the mechanical switch. Based on a requirement on a size of the smartwatch, a quantity of brush gears that can be designed inside the mechanical switch is limited, and about three gears may be designed. As a result, it is difficult to adjust a software identification threshold and a step value, and user experience is undesirable. In addition, it is difficult to ensure rotation reliability of the mechanical switch.

SUMMARY

Embodiments of the present invention provide an information processing method and a mobile device, so that content displayed on a display device can be conveniently adjusted.

According to one aspect, a specific embodiment of the present invention provides a mobile device, including a device body and a magnetic adjustment mechanism, where the magnetic adjustment mechanism includes a magnetic adjustment member and a magnetic sensor, and the magnetic adjustment member is adjusted to enable the magnetic sensor to generate a pulse signal; and the device body further includes a processor and a display screen, and the processor receives the pulse signal generated by the magnetic adjustment mechanism, processes the pulse signal, and then displays adjusted content by using the display screen. It is more convenient to operate the device by using the magnetic adjustment mechanism.

In a possible design, the magnetic adjustment member is a magnetic ring, the magnetic ring includes a plurality of magnetic sets, and the magnetic set includes an S-pole magnetic piece whose polarity is "south pole" and an N-pole magnetic piece whose polarity is "north pole". It is more convenient to operate the device by using the magnetic adjustment mechanism.

3. The mobile device according to claim 2, where the magnetic ring further includes a roller, and the plurality of magnetic sets are disposed on the roller. It is more convenient to operate the device by using the magnetic adjustment mechanism.

In a possible design, that the magnetic adjustment member is adjusted to enable the magnetic sensor to generate a pulse signal specifically includes: rotating the magnetic ring, so that a magnetic line generated by the magnetic ring passes through the magnetic sensor and the magnetic sensor generates the pulse signal. It is more convenient to operate the device by using the magnetic adjustment mechanism.

In a possible design, the mobile device is a smartwatch. In this way, it is more convenient to operate the smartwatch.

In a possible design, the magnetic sensor includes a first output part and a second output part, the first output part outputs a first pulse signal, the second output part outputs a second pulse signal, and a half phase difference is formed between the first pulse signal and the second pulse signal. It is more convenient to operate the device by using the magnetic adjustment mechanism.

According to another aspect, a specific embodiment of the present invention provides a mobile device, including a device body and an adjustment mechanism, where the adjustment mechanism includes an adjustment component and an optical sensor, and the adjustment component enables the optical sensor to generate a pulse signal; and the device body further includes a processor and a display screen, and the processor receives the pulse signal generated by the adjustment mechanism, processes the pulse signal, and then displays adjusted content by using the display screen. It is more convenient to adjust the device by using the adjustment component.

In a possible design, the adjustment component is a sliding piece, the sliding piece is disposed on the device body in a sliding manner, and the sliding piece includes a plurality of different color areas. That the adjustment component enables the optical sensor to generate a pulse signal specifically includes: aligning the different color areas of the sliding piece with the optical sensor, so that the optical sensor generates the pulse signal. It is more convenient to adjust the device by disposing the different color areas.

In a possible design, the plurality of different color areas included on the sliding piece include a first color area, a second color area, and a third color area that are adjacently disposed, the second color area of the sliding piece is a normal location that is aligned with the optical sensor, and when the sliding piece is released after being driven to slide to another color area, the sliding piece automatically slides back to the second color area. It is more convenient to adjust the device by disposing the different color areas.

In a possible design, the mobile device is a smartwatch. In this way, it is more convenient to adjust the smartwatch.

According to still another aspect, a specific embodiment of the present invention provides an information processing method. The method specifically includes: receiving, by a magnetic sensor, a magnetic field signal generated by a magnetic adjustment member, where the magnetic field signal is a magnetic field signal whose magnetic field strength is alternately changed; generating a pulse signal based on the magnetic field signal, where the pulse signal includes a first pulse signal and a second pulse signal; adjusting the first pulse signal and the second pulse signal, so that a one-quarter-cycle phase difference is formed between the first pulse signal and the second pulse signal; and sending the first pulse signal generated in one cycle and the second pulse signal generated in the one cycle to a processor, so that the processor outputs a control instruction based on the first pulse signal in the one cycle and the second pulse signal in the one cycle. It is more convenient to operate a device by using a magnetic adjustment mechanism.

In a possible design, the magnetic field signal whose magnetic field strength is alternately changed is generated by rotating a magnetic ring, the magnetic ring includes a plurality of magnetic sets, and the magnetic set includes an S-pole magnetic piece whose polarity is "south pole" and an N-pole magnetic piece whose polarity is "north pole". It is more convenient to operate the device by using the magnetic adjustment mechanism.

In a possible design, the magnetic ring further includes a roller, and the plurality of magnetic sets are disposed on the roller. It is more convenient to operate the device by using the magnetic adjustment mechanism.

In a possible design, that the magnetic adjustment member is adjusted to enable the magnetic sensor to generate a pulse signal specifically includes: rotating the magnetic ring, so that a magnetic line generated by the magnetic ring passes through the magnetic sensor and the magnetic sensor generates the pulse signal. It is more convenient to operate the device by using the magnetic adjustment mechanism.

In a possible design, the mobile device is a smartwatch. In this way, it is more convenient to adjust the smartwatch.

In a possible design, the magnetic sensor includes a first output part and a second output part, the first output part outputs the first pulse signal, the second output part outputs the second pulse signal, and a half phase difference is formed between the first pulse signal and the second pulse signal. It is more convenient to operate the device by using the magnetic adjustment mechanism.

According to yet another aspect, a specific embodiment of the present invention provides an information processing method, where the method specifically includes: receiving, by an optical sensor, a signal sent by an adjustment component, where the signal includes a first signal or a second signal; and sending the received first signal or the received second signal to a processor, and outputting a first control instruction or a second control instruction based on the first signal or the second signal by using the processor. It is more convenient to adjust the device by using the adjustment component.

The present invention provides an information processing method and a mobile device. The mobile device includes a device body and an adjustment mechanism. Content displayed on the device body is adjusted by using the adjustment mechanism. This avoids a problem that adjustment cannot be conveniently performed because a display screen is covered by a finger when an operation is performed directly on the display screen.

DESCRIPTION OF EMBODIMENTS

The technical solutions in the embodiments of the present invention are further described in detail with reference to accompanying drawings and embodiments.

The present invention provides a mobile device, and the mobile device includes a device body and an adjustment mechanism. Content displayed on the device body is adjusted by using the adjustment mechanism. This avoids a problem that adjustment cannot be conveniently performed because a display screen is covered by a finger when an operation is performed directly on the display screen. In a specific embodiment of the present invention, the mobile device includes a wearable device (such as a smartwatch), a tablet computer, a mobile phone, or the like.

For ease of description, in a specific embodiment of the present invention, only the smartwatch is used as an example for detailed description.

Figure 1:
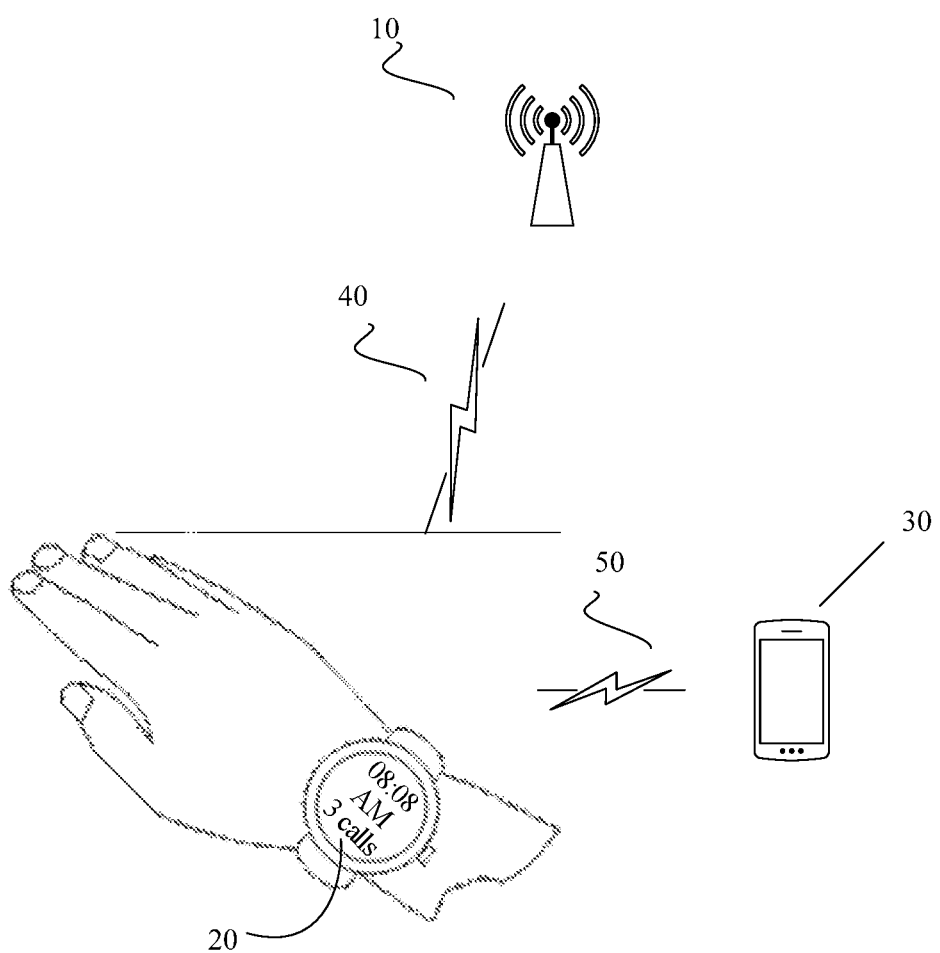
FIG. 1 is a diagram of an application scenario of a mobile device according to a specific embodiment of the present invention.

FIG. 1 is a diagram of an application scenario of a smartwatch according to a specific embodiment of the present invention. As shown in FIG. 1, this embodiment of the present invention relates to a smartwatch 20. The smartwatch 20 may perform wireless communication with a network-side base station 10 or a mobile phone 30 in a wireless manner. For example, the smartwatch may send a radio signal to the base station 10 through a wireless communications link 40 by using a radio frequency circuit and an antenna of the smartwatch 20, to request the base station 10 to provide a wireless network service for processing a specific service requirement of the smartwatch 20. For another example, the smartwatch 20 may perform matching with the mobile phone 30 by using Bluetooth of the smartwatch 20, and perform data communication with the mobile phone 30 through a Bluetooth communications link 50 after the matching succeeds. Certainly, the smartwatch 20 may also perform data communication with the mobile phone 30 in another wireless communication manner, such as a radio frequency identification technology or a Near Field Communication technology. In addition, the smartwatch 20 may also detect a change of an external environment by using various sensors of the smartwatch 20.

Figure 2:
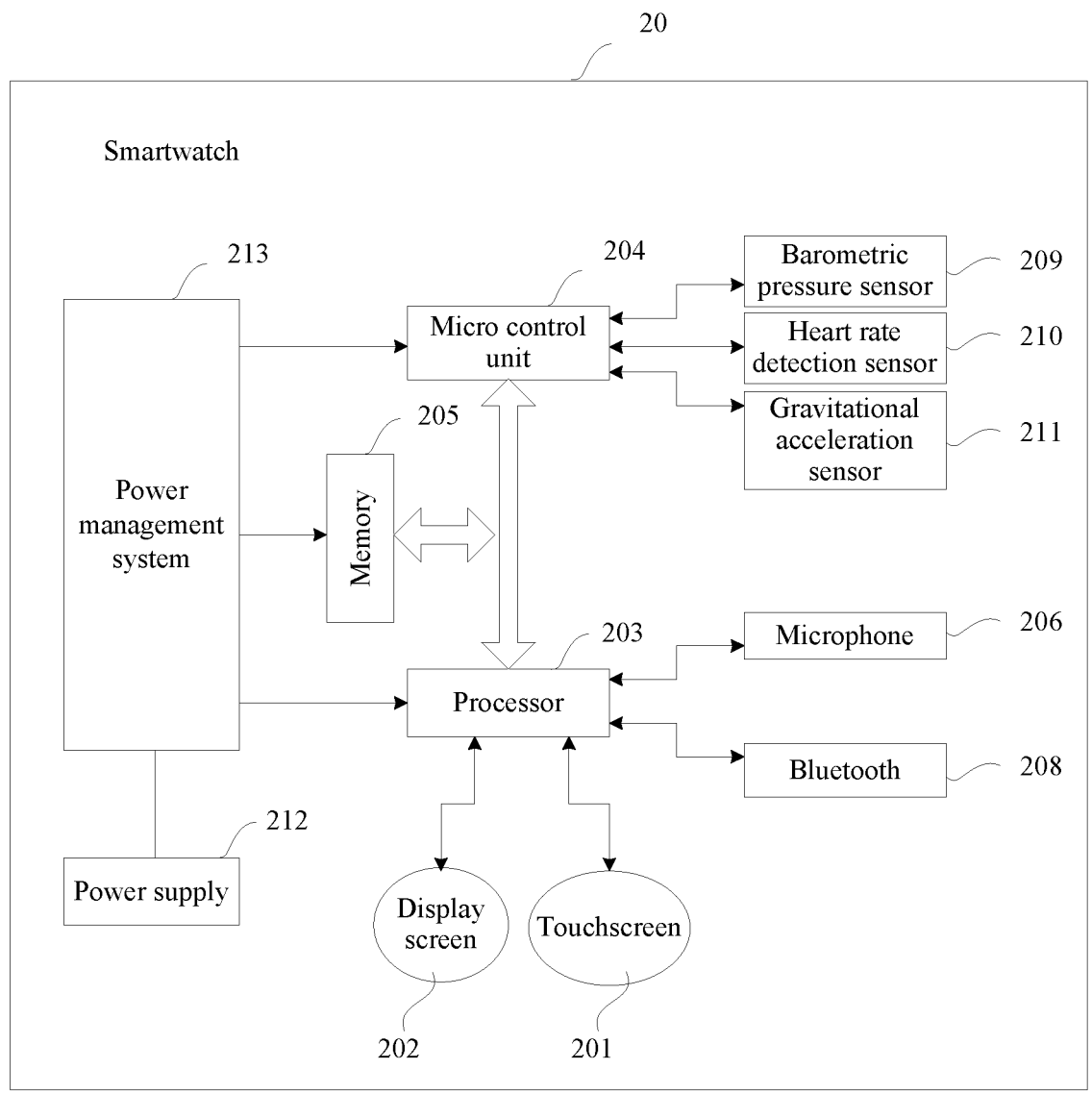
FIG. 2 is a structural diagram of hardware of a smartwatch according to a specific embodiment of the present invention.

FIG. 2 is a structural diagram of hardware of the smartwatch according to a specific embodiment of the present invention. As shown in FIG. 2, the smartwatch 20 may specifically include a watch body and a wristband that are connected to each other. The watch body includes a front cover (not shown in FIG. 2), a touch panel 201 (also referred to as a touchscreen), a display screen 202, a back cover (not shown in FIG. 2), a processor 203, a micro control unit (MCU) 204, a memory 205, a microphone (MIC) 206, Bluetooth (BT) 208, a barometric pressure sensor 209, a heart rate detection sensor 210, a gravitational acceleration sensor 211, a power supply 212, a power management system 213, and the like. Although not shown, an antenna, a Wireless Fidelity (Wi-Fi) module, a Near field Communication (NFC) module, a Global Positioning System (GPS) module, a loudspeaker, an accelerometer, a gyroscope, and the like may be further included in the smartwatch.

The following separately describes functional components of the smartwatch 20.

The touch panel 201, also referred to as a touchscreen, may collect a touch operation performed by a user of the smartwatch 20 on the touch panel 201 (such as an operation performed by the user on the touch panel or near the touch panel by using a finger or any proper object or accessory such as a stylus), and drive a corresponding connection apparatus based on a preset program. Optionally, the touch panel 201 may include two parts: a touch detection apparatus and a touch controller. The touch detection apparatus detects a touch azimuth of the user, detects a signal brought by a touch operation, and transmits the signal to the touch controller. The touch controller receives touch information from the touch detection apparatus, converts the touch information into contact coordinates, and sends the contact coordinates to the processor 203, and can receive a command sent by the processor 203 and execute the command. In addition, the touch panel may be implemented in a plurality of types, such as a resistive type, a capacitive type, an infrared type, and a surface acoustic wave type. In addition to the touchscreen 201, the smartwatch may further include another input device. The another input device may include but is not limited to a function key (such as a volume control key or a power on/off key).

The display screen 202 may be configured to display information entered by the user or information provided for the user, and various menus of the watch. Optionally, the display screen 202 may be configured in a form of a liquid crystal display (LCD), an organic light-emitting diode (OLED), or the like. Further, the touch panel 201 may cover the display screen 202. After detecting a touch operation on or near the touch panel 201, the touch panel 201 transmits information about the touch operation to the processor 203 to determine a touch event type, and then, the processor 203 provides corresponding visual output on the display screen 202 based on the touch event type. In FIG. 2, the touch panel 201 and the display screen 202 are used as two independent components to implement input and output functions of the watch. However, in some embodiments, the touch panel 201 and the display screen 202 may be integrated to implement the input and output functions of the watch.

The processor 203 is configured to perform system scheduling, control the display screen and the touchscreen, and support processing of the microphone 206, one or more filmy actuators 207, the Bluetooth 208, and the like. For example, the processor 203 may be a Qualcomm APQ8026 chip.

The microphone 206 is also referred to as a microphone. The microphone 204 may convert a collected sound signal into an electrical signal, and an audio frequency circuit receives the electrical signal and converts the electrical signal into audio data. The audio frequency circuit may also convert audio data into an electrical signal and transmit the electrical signal to the loudspeaker, and the loudspeaker converts the electrical signal into a sound signal and outputs the sound signal.

The Bluetooth 208: the smartwatch may exchange information with another electronic device (such as a mobile phone or a tablet computer) by using Bluetooth, and connect to a network and a server by using the foregoing electronic device, to implement functions such as speech recognition.

The micro control unit 204 is configured to implement functions such as sensor control, sensor data computation, and communication with the processor 203.

The sensor may be the barometric pressure sensor 209, the heart rate detection sensor 210, the gravitational acceleration sensor 211, an optical sensor, a motion sensor, or another sensor. Specifically, the optical sensor may include an ambient light sensor and a proximity sensor. For another sensor that may further be disposed in the watch, such as a gyroscope, a barometer, a hygrometer, a thermometer, or an infrared sensor, details are not described herein.

The memory 205 is configured to store a software program and data. The processor 203 executes various function applications and data processing of the watch by running the software program and the data that are stored in the memory. The memory 205 mainly includes a program storage area and a data storage area. The program storage area may store an operating system, an application program required for at least one function (such as a sound playback function and an image playback function). The data storage area may store data (such as audio data and a phone book) created based on use of the watch. In addition, the memory may include a high-speed random access memory, and may further include a non-volatile memory such as a disk storage device, a flash memory device, or another volatile solid-state storage device.

The watch further includes the power supply 212 (such as a battery) that provides power to various components. Preferably, the power supply 212 may be logically connected to the processor 203 by using the power management system 213, so as to implement functions such as charge management, discharge management, and power consumption management by using the power management system 213.

Figure 3:
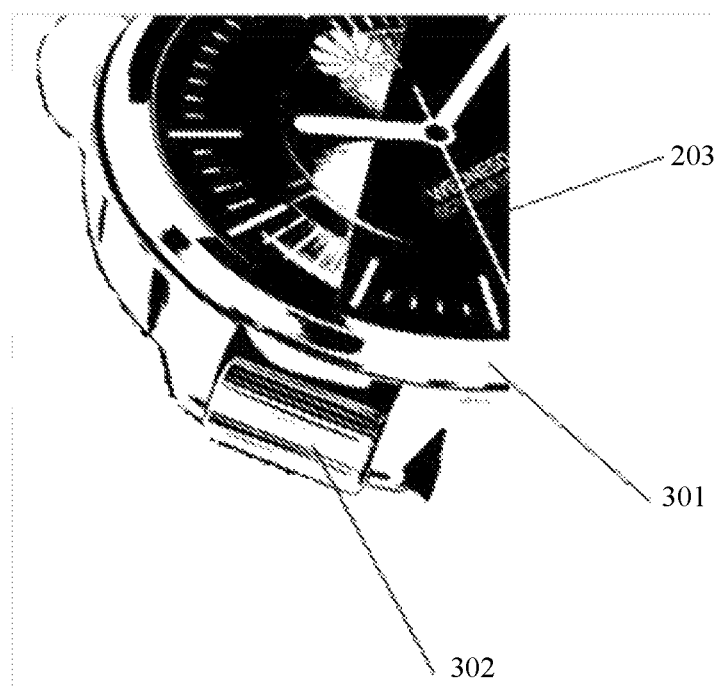
FIG. 3 is a schematic structural diagram of an exterior view of a smartwatch according to an embodiment of the present invention.

FIG. 3 is a schematic structural diagram of an exterior view of the smartwatch according to an embodiment of the present invention. As shown in FIG. 3, the smartwatch 20 further includes a watch face 301 and a magnetic adjustment mechanism 302. The magnetic adjustment mechanism 302 is disposed on the watch face 301. By adjusting the magnetic adjustment mechanism 302, the user adjusts content displayed on the display screen 202 of the smartwatch 20, for example, performs an operation such as zooming-in or zooming-out on the content displayed on the display screen 202. This avoids a technical problem that adjustment is rather complex because of a limitation of a quantity of brush gears inside a mechanical rotary switch when an operation is performed, by using the rotary switch, on the content displayed on the display screen 202.

Figure 4:
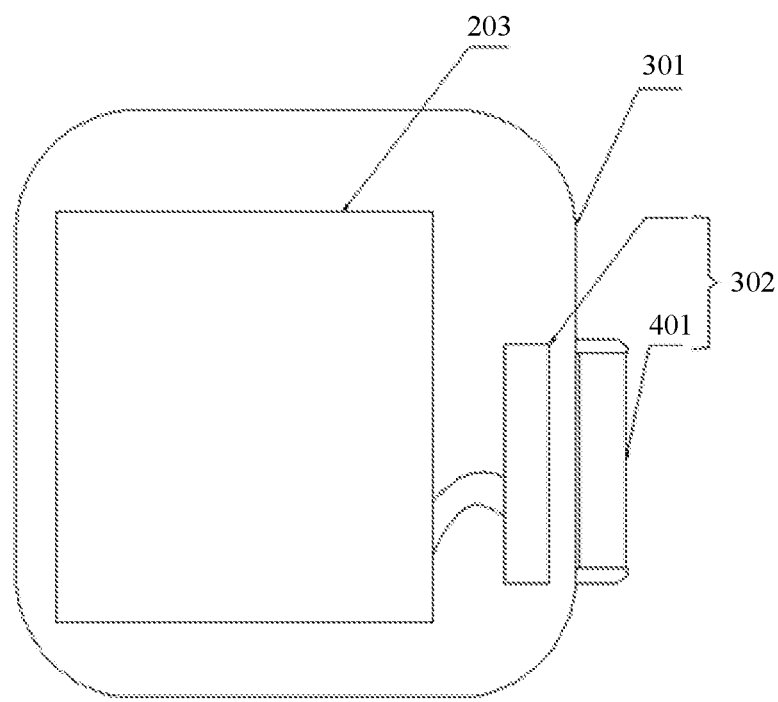
FIG. 4 is a diagram of an interior structure of a smartwatch according to a specific embodiment of the present invention.

FIG. 4 is a diagram of an interior structure of the smartwatch according to a specific embodiment of the present invention. As shown in FIG. 4, the magnetic adjustment mechanism 302 includes a magnetic ring 401 and a magnetic sensor 402. In an example, the magnetic ring 401 is disposed on an external side surface of the watch face 301, and the magnetic sensor 402 is disposed inside the watch face 401. The magnetic sensor 402 is electrically connected to the processor 203 inside the watch face 301, and the magnetic sensor 402 sends, to the processor 203, an electrical signal generated based on a change of a magnetic field. The processor 203 processes the received electrical signal, so as to adjust the content displayed on the display screen 202 of the smartwatch, for example, perform an operation such as zooming-in or zooming-out on the content displayed on the display screen 202.

In this specific embodiment of the present invention, the magnetic sensor 402 may be a magnetic sensor that uses a Hall element, an anisotropic magneto resistance (AMR) element, a giant magneto resistance (GMR) element, a tunnel magneto resistance (TMR) junction element, or the like as a sensitive element. For ease of description, in this specific embodiment of the present invention, the AMR element is used as an example for description.

Figure 5:
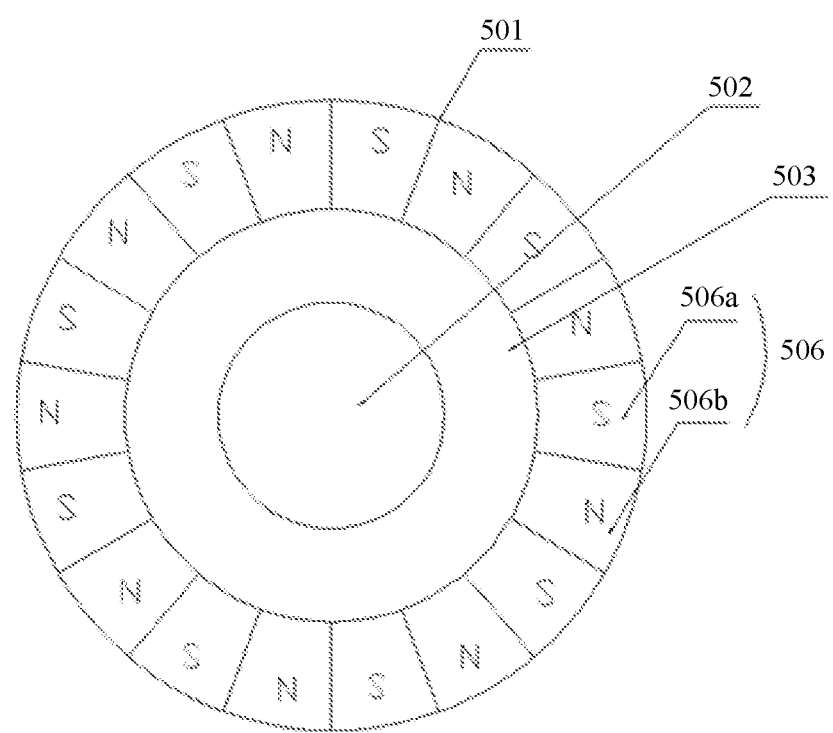
FIG. 5 is a structural cross-section view of a roller-structure magnetic ring according to a specific embodiment of the present invention.

FIG. 5 is a structural cross-section view of a roller-structure magnetic ring according to a specific embodiment of the present invention. As shown in FIG. 5, the roller-structure magnetic ring includes a magnetic ring 501, a roller 503, and a connecting post 502. The magnetic ring 501 is fixedly disposed on the roller 503, and the roller 503 sleeves the connecting post 502. The roller 503 may rotate around the connecting post 502. The connecting post 502 is fixedly connected to the watch face 301. The magnetic ring 501 includes a plurality of magnetic sets 506, and each magnetic set 506 includes an S-pole magnetic piece 506a and an N-pole magnetic piece 506b. A plurality of N-pole-to-S-pole magnetic lines are generated on the magnetic ring 501. The magnetic lines pass through the magnetic sensor 402, so that the magnetic sensor generates a signal.

Figure 6:
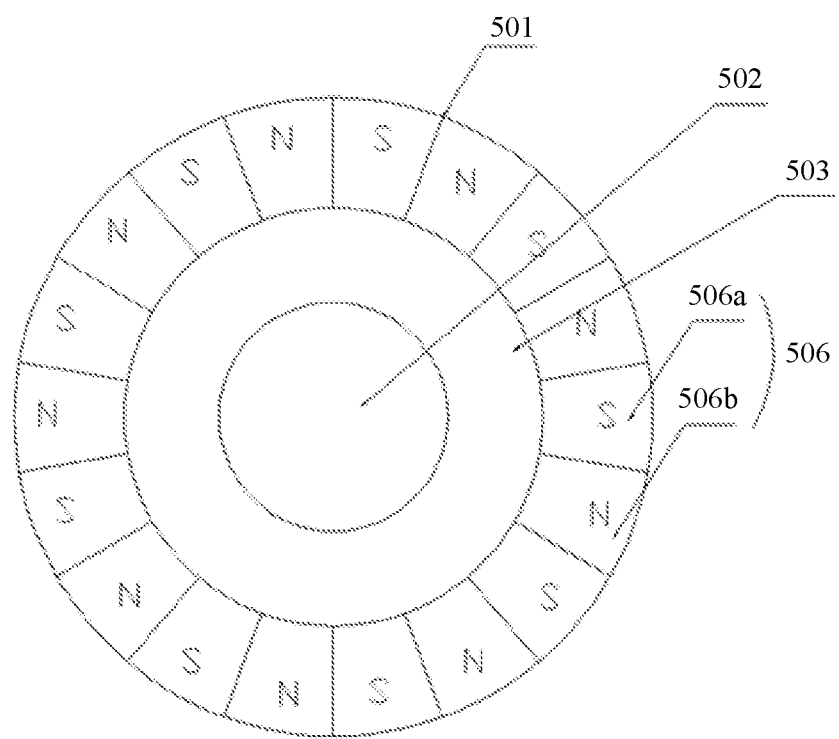
FIG. 6 is a schematic cross-section view of a magnetic ring according to a specific embodiment of the present invention.

FIG. 6 is a schematic cross-section view of a magnetic ring according to a specific embodiment of the present invention. As shown in FIG. 6, the magnetic ring includes a plurality of magnetic sets 601 and a connecting post 602. The magnetic set 601 includes a magnetic piece 601a whose polarity is "north pole" (N pole) and a magnetic piece 601b whose polarity is "south pole" (S pole). The plurality of magnetic sets form the magnetic ring 605. The magnetic ring 605 is directly affixed onto the connecting post, and the connecting post 602 is connected to the watch face 301 and can rotate around the watch face 301. A magnetic line 606 is further generated on the magnetic ring 605, and a direction of the magnetic line 606 is from the N-pole magnetic piece 601a to the S-pole magnetic piece 601b.

Figure 7:
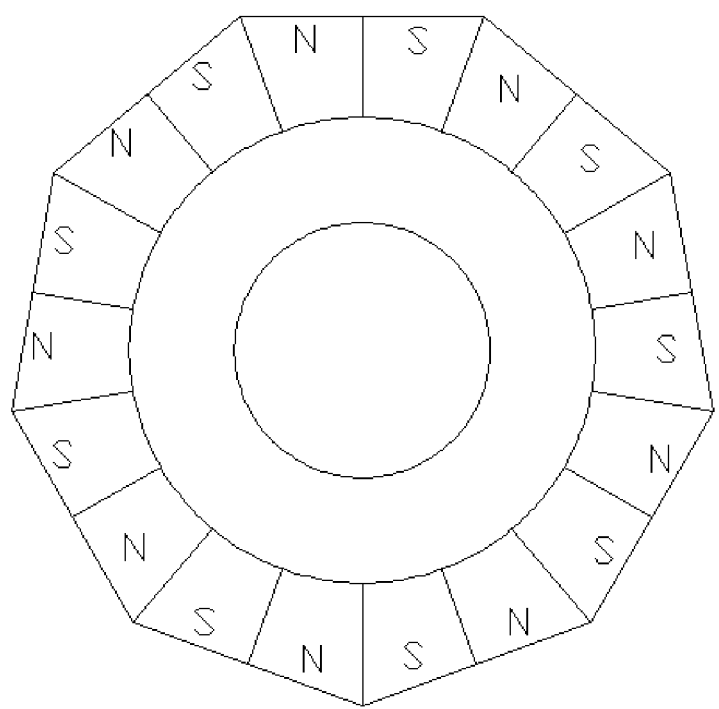
FIG. 7 is a structural cross-section view of a polygon magnetic ring.
Figure 8:
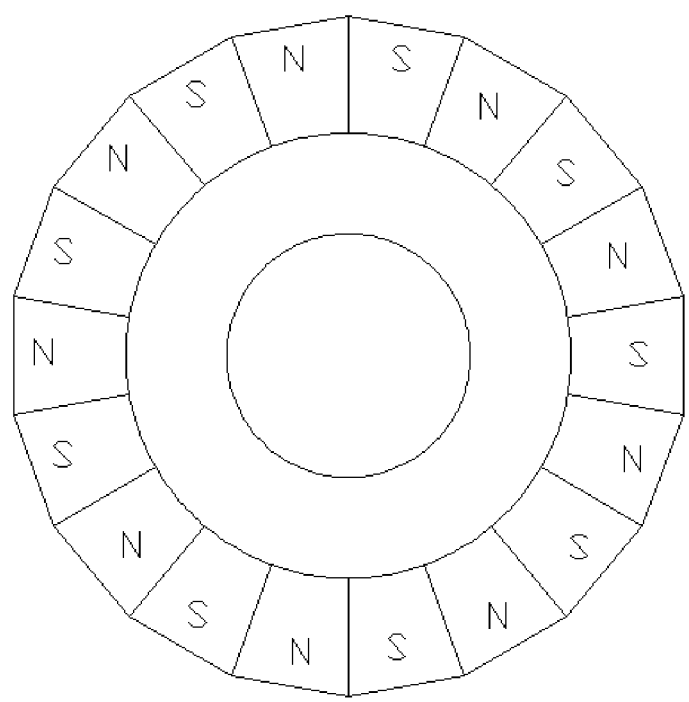
FIG. 8 is a structural cross-section view of a polygon magnetic ring according to a specific embodiment of the present invention.

In the specific embodiments of the present invention, a shape of the magnetic ring shown in FIG. 5 or FIG. 6 is merely an example, and should not be construed as any limitation on the present invention. Any magnetic ring that includes a plurality of magnetic sets shall be the magnetic ring defined in the embodiments of the present invention. In the specific embodiments of the present invention, an external surface of the magnetic ring 301 formed by the plurality of S-pole magnetic pieces 506a and the plurality of N-pole magnetic pieces 506b may alternatively be a rhombus, and one S-pole magnetic piece and one N-pole magnetic piece form one rhombus side. In an example, the external surface may be of a structural cross-section view of a polygon magnetic ring shown in FIG. 7. As shown in FIG. 7, the magnetic ring includes a plurality of magnetic sets, each magnetic set includes one N-pole magnetic piece and one S-pole magnetic piece, and one magnetic set forms one rhombus side. In another example, FIG. 8 is a structural cross-section view of a polygon magnetic ring according to a specific embodiment of the present invention. As shown in FIG. 8, the magnetic ring includes a plurality of magnetic sets, each magnetic set includes one N-pole magnetic piece and one S-pole magnetic piece, and each magnetic piece forms one rhombus side.

In the specific embodiments of the present invention, an AMR magnetic sensor is used as an example for description. The magnetic sensor includes a magneto-impedance element, and impedance of the magneto-impedance element varies based on a change of magnetic field strength. Specifically, when an alternating magnetic field exists in the magnetic sensor, distribution of a current inside the magneto-impedance element is uneven, and the current concentrates in a film of an external surface of the magneto-impedance element, so that an actual current inside the magneto-impedance element decreases as current density of the surface of the magneto-impedance element increases, so that resistance inside the magneto-impedance element increases. When strength of the magnetic field in which the magneto-impedance element resides increases, a current in the external film of the magneto-impedance element is more concentrated, and therefore, there is a larger current on the surface of the magneto-impedance element and a smaller current inside the magneto-impedance element. As a result, the resistance inside the magneto-impedance element increases. Therefore, in the alternating magnetic field, a signal output by the magnetic sensor cyclically varies with the change of the magnetic field strength.

Figure 9:
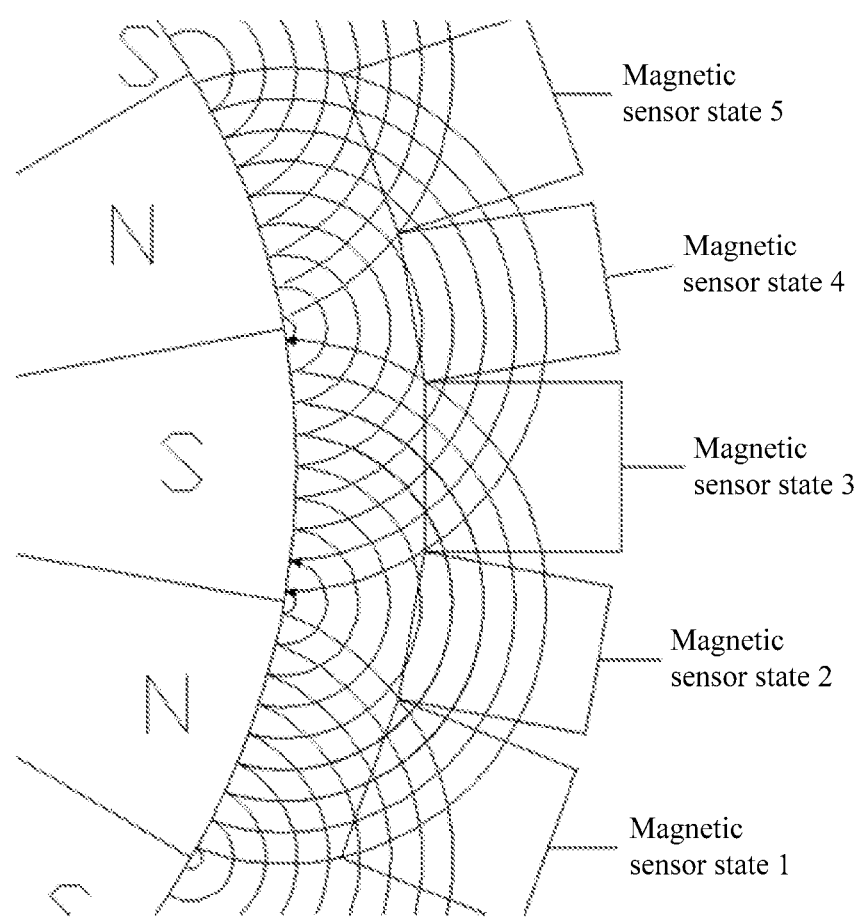
FIG. 9 is a magnetic sensor disposed in a magnetic field according to a specific embodiment of the present invention.

FIG. 9 is a magnetic sensor disposed in a magnetic field according to a specific embodiment of the present invention. FIG. 9 shows a magnetic sensor disposed in a magnetic field. The magnetic field includes a strong magnetic field area in which multiple-direction magnetic lines are distributed in an overlapped manner and a magnetic field area of single-direction magnetic lines. For example, when a magnetic ring and the magnetic sensor are in a state 1, a state 3, and a state 5, maximum magnetic field strength is detected, and the magnetic sensor outputs minimum voltage; when the magnetic sensor is in a state 2 and a state 4, minimum magnetic field strength is detected, and the magnetic sensor outputs maximum voltage.

In an example, when the magnetic ring and the magnetic sensor are in the state 1, the magnetic sensor outputs a low-level signal. When a user rotates the magnetic ring, so that a relative position between magnetic lines of the magnetic ring and the magnetic sensor turns from the state 1 to the state 2, voltage output by the magnetic sensor gradually varies from the minimum to the maximum. When the relative position between the magnetic ring and the magnetic sensor is in the state 2, the minimum magnetic field strength is detected, and the magnetic sensor outputs a high-level signal. The magnetic ring is still rotated, so that the relative position between the magnetic ring and the magnetic sensor turns from the state 2 to the state 3. When the relative position between the magnetic ring and the magnetic sensor is turning from the state 2 to the state 3, the magnetic sensor outputs a low-level signal.

It can be learned based on the foregoing example that the magnetic sensor generates a gradually-changing voltage signal, that is, an analog signal, during the rotating of the magnetic ring. The magnetic sensor further includes a digital-to-analog conversion unit. The analog signal is converted into a digital signal by using the digital-to-analog conversion unit.

In the specific embodiments of the present invention, the smartwatch determines a first instruction or a second instruction based on a signal output by the magnetic sensor, so as to adjust displayed content. The magnetic sensor 301 includes two signal output ports. Whether the first instruction or the second instruction is output is determined by using electrical signals output by the two output ports, to adjust the displayed content. For example, when page-turning is performed on a photo book or other displayed content, whether the first instruction or the second instruction is output is determined by comparing two signals, so that whether paging-up or paging-down is performed on the displayed phone book or the other displayed content or whether zooming-out or zooming-in is performed on the displayed content is determined. In an example, the first instruction further includes a first sound effect and/or a first vibration, and the second instruction further includes a second sound effect and/or a second vibration. Whether paging-up or paging-down and/or zooming-out or zooming-in are/is performed on the displayed content is distinguished by using the first sound effect and the second sound effect and/or the first vibration and the second vibration.

In the specific embodiments of the present invention, the magnetic sensor includes two signal output ports: a first output port and a second output port. The first output port outputs a first signal, and the second output port outputs a second signal. The first signal output by the first output port and the second signal output by the second output port are transmitted to the processor 203. The processor 203 determines a to-be-output control instruction by determining the first signal and the second signal, and controls, by using the control instruction, the content displayed on the display screen 202. The first signal output by the first output port and the second signal output by the second output port may be 1 or 0. When the magnetic ring starts to be rotated, the magnetic ring turns in one direction; and when the magnetic ring turns to an adjacent N-pole magnetic piece, the processor 203 starts to tap off a signal. When the magnetic ring is rotated from one N-pole magnetic piece to another adjacent N-pole magnetic piece, the first output port and the second output port of the magnetic sensor output signals of one cycle. When the first output port and the second output port of the magnetic sensor output signals of one cycle, the processor 203 outputs a first control instruction.

In the specific embodiments of the present invention, the processor 202 is configured to output the first control instruction or a second control instruction based on the signals of one cycle that are input by the first output port and the second output port of the magnetic sensor. When a signal output by the first output port is 1 and a signal output by the second output port is 0 in a second quarter of a cycle, and when a signal output by the first output port is 1 and a signal output by the second output port is 1 in a third quarter of the cycle, the processor determines that the first control instruction is to be output. When a signal output by the first output port is 0 and a signal output by the second output port is 1 in a second quarter of a cycle, and when a signal output by the first output port is 1 and a signal output by the second output port is 1 in a third quarter of the cycle, the processor 203 determines that the second control instruction is to be output.

In the specific embodiments of the present invention, the first control instruction is used to but is not limited to perform adjustment, for example, zooming in an image, paging up displayed content, turning a volume up, and fast-forwarding played-back content. The second control instruction is used to but is not limited to perform adjustment, for example, zooming out an image, paging down displayed content, turning a volume down, and rewinding played-back content. The foregoing describes a specific scope in which the first control instruction and the second control instruction may be used, but is not intended to limit content that may be adjusted by using the first control instruction and the second control instruction. In any two corresponding adjustment manners, the first control instruction and the second control instruction in the present invention can be used to perform adjustment.

Figure 10A:
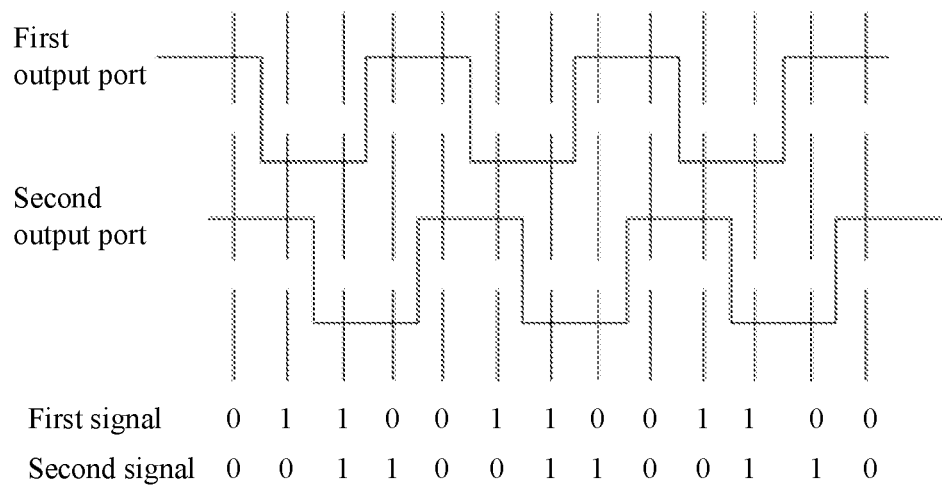
FIG. 10A is a signal that enables a processor to output a paging-up instruction and that is output by a magnetic sensor, according to a specific embodiment of the present invention.

FIG. 10A is a signal that is used to perform paging-up on displayed content and that is output by a magnetic sensor, according to a specific embodiment of the present invention. As shown in FIG. 10A, in a first quarter of one cycle, a signal output by a first output port of the magnetic sensor is 0, and a signal output by an output port 2 is 0. In a second quarter of the one cycle, the magnetic ring is still rotated, so that a signal output by the first output port of the magnetic sensor is 1, and a signal output by the second output port is 0. In a third quarter of the one cycle, the magnetic ring is rotated, so that a signal output by the first output port of the magnetic sensor is 1, and a signal output by the second output port is 1. In a fourth quarter of the one cycle, the magnetic ring is still rotated, so that a signal output by the first output port of the magnetic sensor is 1, and a signal output by the second output port is 1.

The magnetic sensor sends, to the processor 203, the signals output in the one cycle. The processor 203 determines, based on that the signal output by the first output port is 1 and the signal output by the second output port is 0 in the second quarter of the one cycle and that the signal output by the first output port is 1 and the signal output by the second output port is 1 in the third quarter of the one cycle, that a first control instruction is to be output, and outputs the first control instruction.

Figure 10B:
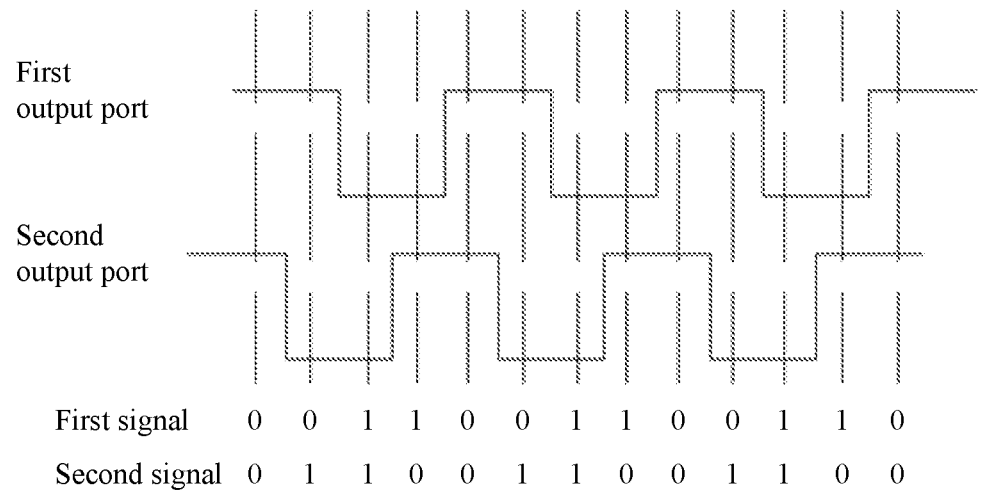
FIG. 10B is a signal that enables a processor to output a paging-down instruction and that is output by a magnetic sensor, according to a specific embodiment of the present invention.

FIG. 10B is a signal that enables a processor to output a paging-down instruction and that is output by a magnetic sensor, according to a specific embodiment of the present invention. As shown in FIG. 10B, in a first quarter of one cycle, a signal output by a first output port of the magnetic sensor is 0, and a signal output by a second output port is 0. In a second quarter of the one cycle, the magnetic ring is still rotated, so that a signal output by the first output port of the magnetic sensor is 0, and a signal output by the second output port is 1. In a third quarter of the one cycle, the magnetic ring is rotated, so that a signal output by the first output port of the magnetic sensor is 1, and a signal output by the second output port is 1. In a fourth quarter of the one cycle, the magnetic ring is still rotated, so that a signal output by the first output port of the magnetic sensor is 1, and a signal output by the second output port is 1.

The magnetic sensor sends, to the processor, the signals output in the one cycle. The processor determines, based on that the signal output by the first output port is 0 and the signal output by the second output port is 1 in the second quarter of the one cycle and that the signal output by the first output port is 1 and the signal output by the second output port is 1 in the third quarter of the one cycle, that a second control instruction is to be output, and the processor outputs the second control instruction.

Therefore, different control instructions are output to the processor 203 based on the content shown in FIG. 10A and FIG. 10B and different directions in which the magnetic ring is rotated. The processor controls, based on the control instructions, content displayed on the display screen 202.

In the specific embodiments of the present invention, the magnetic sensor includes magnetic sensor circuits, including a first output circuit and a second output circuit. The first output circuit includes the first output port, and the second output circuit includes the second output port. A first signal output by the first port and a second signal output by the second port have a specified phase difference with each other, and the signals are shown in FIG. 10A and FIG. 10B.

The following uses some specific examples to describe a change after a controller outputs the first control instruction or the second control instruction in this embodiment of the present invention. It should be noted that the following describes only some cases of the change after the first control instruction or the second control instruction is output in the present invention, and the present invention should not be limited to the following cases.

Figure 11A:
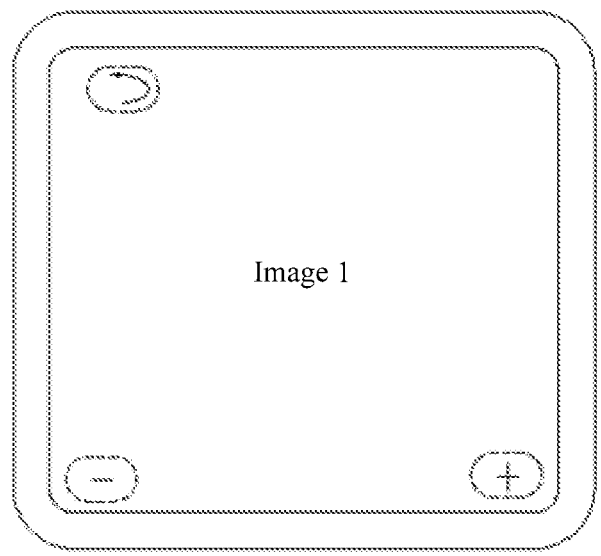
FIG. 11A is a schematic diagram in which an image is displayed in full screen on a smartwatch, according to a specific embodiment of the present invention.
Figure 11B:
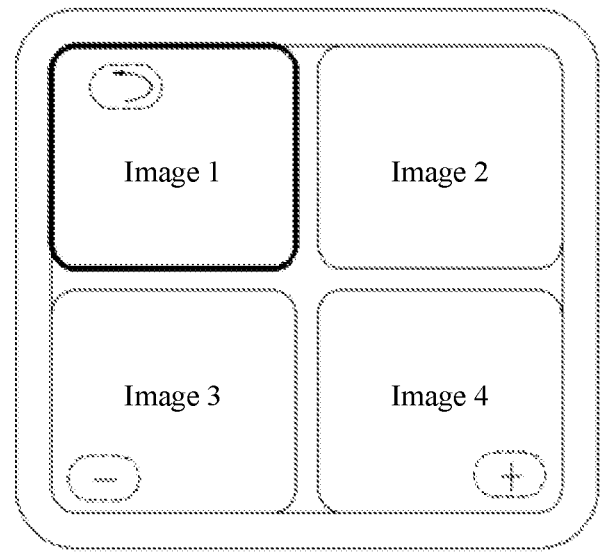
FIG. 11B is an effect of displaying a plurality of images on a smartwatch, according to a specific embodiment of the present invention.
Figure 11C:
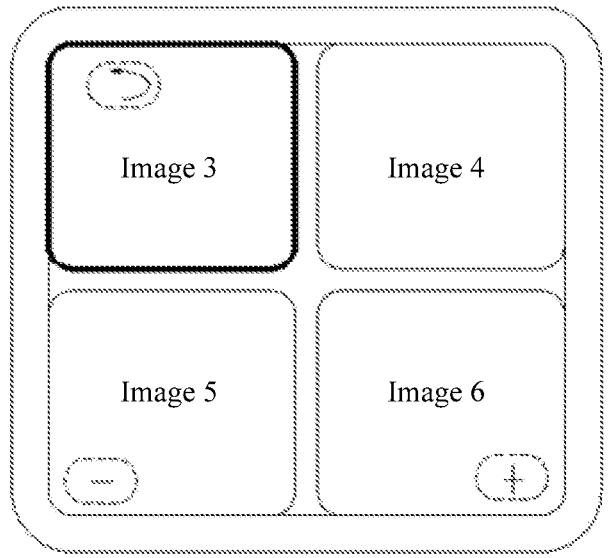
FIG. 11C is an effect of displaying a plurality of images after paging-down is performed on a smartwatch, according to a specific embodiment of the present invention.

In an example, FIG. 11A is a schematic diagram in which an image is displayed in full screen on a smartwatch, according to a specific embodiment of the present invention. As shown in FIG. 11A, the entire display screen displays one image. An upper list is displayed by using an upper left return dashed box, a plurality of images are displayed by using a lower left zoom-out box, and a displayed image is zoomed in by using a lower right zoom-in dashed box. For example, when the magnetic ring is rotated, so that the first output port and the second output port of the magnetic sensor output waves shown in FIG. 10A to the processor 203, and the processor 203 determines and outputs the first control instruction based on the waves, zooming-in is performed on a displayed image, achieving an effect of tapping the lower right zoom-in dashed box. When the magnetic ring is rotated, so that the first output port and the second output port of the magnetic sensor output waves shown in FIG. 10B to the processor 203, and the processor 203 determines and outputs the second control instruction based on the waves, zooming-out is performed on a displayed image and a plurality of images are displayed on the display screen, achieving an effect of tapping the lower left zoom-out dashed box. FIG. 11B is an effect of displaying a plurality of images on a smartwatch, according to a specific embodiment of the present invention. As shown in 11B, in the case shown in FIG. 11A, the magnetic ring is rotated, so that the first output port and the second output port of the magnetic sensor output waves shown in FIG. 10B to the processor 203. The processor 203 determines and outputs the second control instruction based on the waves, and content shown in FIG. 11B is displayed on the display screen. FIG. 11C is an effect of displaying a plurality of images after paging-down is performed on a smartwatch, according to a specific embodiment of the present invention. As shown in 11C, in the case shown in FIG. 11B, when the magnetic ring is rotated, so that the first output port and the second output port of the magnetic sensor output waves shown in FIG. 10B to the processor 203, and the processor 203 determines and outputs the second control instruction based on the waves, content shown in FIG. 11C is displayed on the display screen.

Figure 11D:
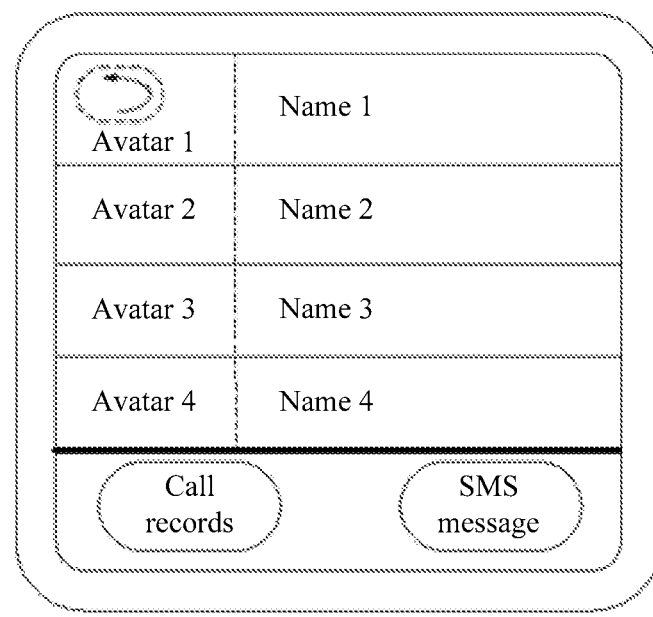
FIG. 11D is a schematic diagram of displaying a phone book on a smartwatch, according to a specific embodiment of the present invention.
Figure 11E:
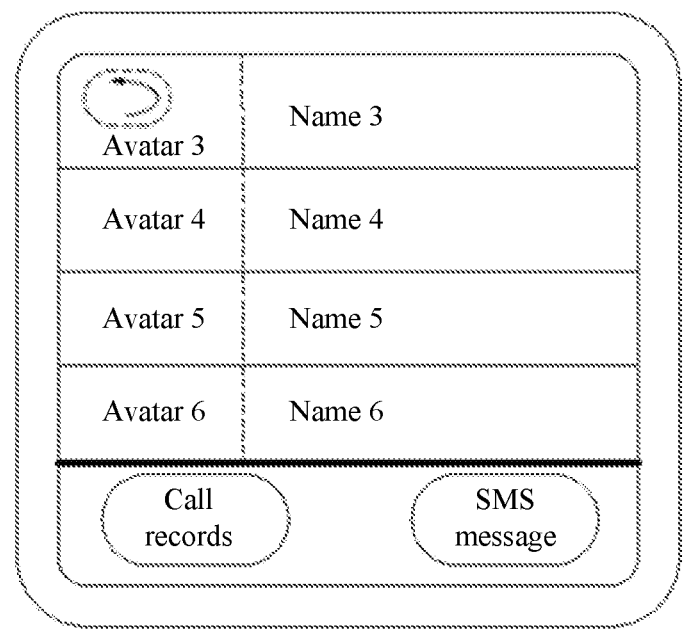
FIG. 11E is a schematic diagram of displaying a phone book after paging-down is performed on a smartwatch, according to a specific embodiment of the present invention.

FIG. 11D is a schematic diagram of displaying a phone book on a smartwatch, according to a specific embodiment of the present invention. As shown in FIG. 11D, a plurality of contacts are displayed. An upper list is displayed by using an upper left return dashed box. A lower part includes a function bar. A lower left part of the shown function bar is a call record solid box, and a call record list is displayed by tapping the call record solid box; a lower right part of the shown function bar is an SMS solid box, and an SMS interface is displayed by tapping the SMS solid box. In the case shown in FIG. 11D, the magnetic ring is rotated, so that the first output port and the second output port of the magnetic sensor output waves shown in FIG. 10B to the processor 203. The processor 203 determines and outputs the second control instruction based on the waves, to page down content displayed on the display screen. FIG. 11E is a schematic diagram of displaying a phone book after paging-down is performed on a smartwatch, according to a specific embodiment of the present invention. In the case shown in FIG. 11D, after the magnetic ring is rotated, so that the first output port and the second output port of the magnetic sensor output waves shown in FIG. 10B to the processor 203, and the processor 203 determines and outputs the second control instruction, content shown in FIG. 11E is displayed on the display screen.

Figure 12:
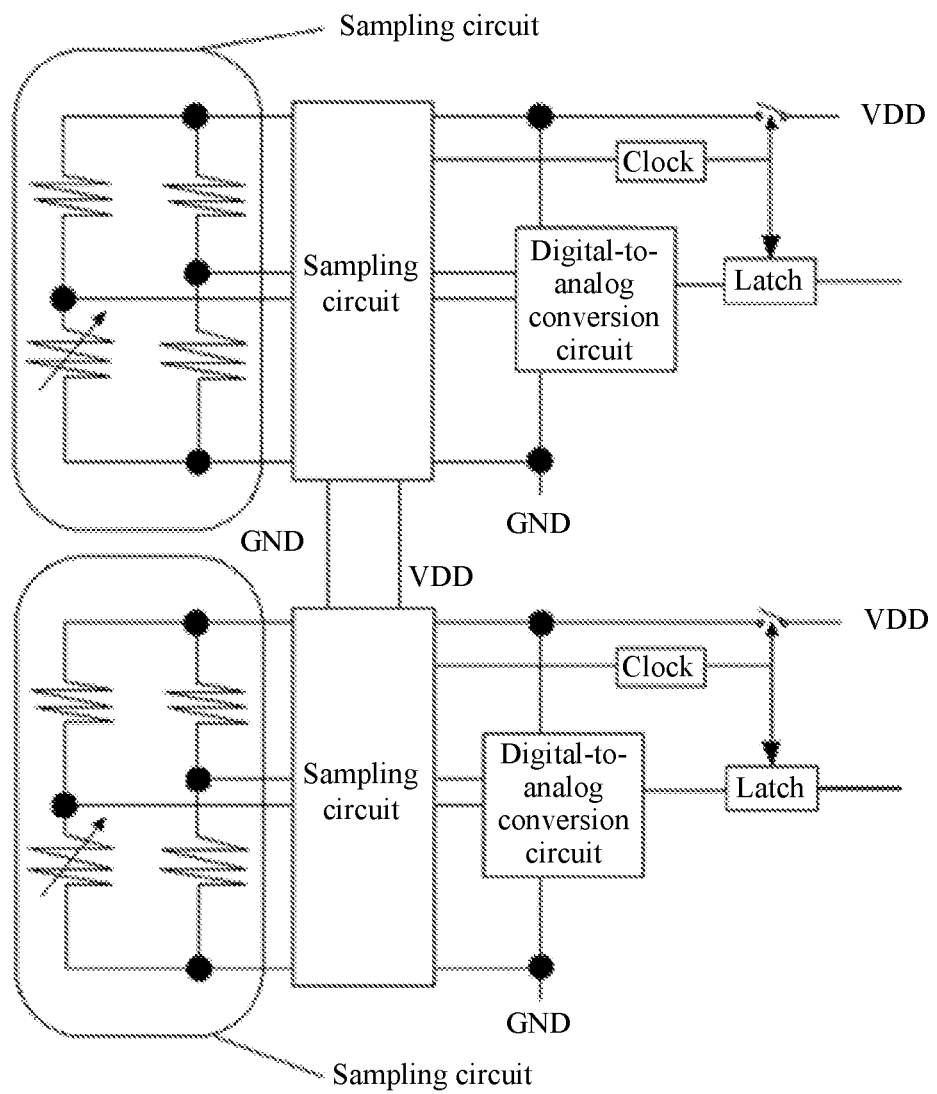
FIG. 12 is a circuit diagram of a magnetic sensor according to a specific embodiment of the present invention.

In an example, FIG. 12 is a circuit diagram of a magnetic sensor according to a specific embodiment of the present invention. As shown in FIG. 12, each output circuit includes a detection circuit, a sampling circuit, a digital-to-analog conversion circuit, a clock, a latch, and an output interface.

The detection circuit is configured to output different voltage based on a magneto resistance change brought by rotating of the magnetic ring. The detection circuit includes a plurality of constant resistors and a plurality of variable resistors with equivalent magneto resistance. The detection circuit outputs different voltage based on the magneto resistance change.

The digital conversion circuit includes an amplifier and an inverted flip-flop. The amplifier receives voltage output by the sampling circuit, amplifies the voltage, and outputs amplified voltage. The inverted flip-flop receives the voltage amplified by the amplifier, and converts the voltage from an analog signal into a digital signal.

The clock includes a pre-configured program, and controls, based on the program, a digital signal that passes through the latch, so that the latch outputs the to-be-output digital signal after delaying the digital signal for a specified period of time.

The latch is configured to be controlled by a clock signal, and control a to-be-output digital signal. For example, a digital signal that passes through the latch is delayed for a specified period of time before being output.

In this specific embodiment of the present invention, when circuits of the magnetic sensor are operating, a clock and a latch of one signal output circuit operate while a clock and a latch of the other signal output circuit do not operate. That is, after voltage in the one signal output circuit passes through the inverted flip-flop and undergoes digital-to-analog conversion, a signal is output directly by the latch. After voltage in the other signal output circuit passes through the inverted flip-flop and undergoes digital-to-analog conversion, the clock controls the latch, so that a digital signal that passes through the latch is latched. In this way, a phase difference exists between a signal output by one signal output circuit and a signal output by the other signal output circuit.

Figure 13:
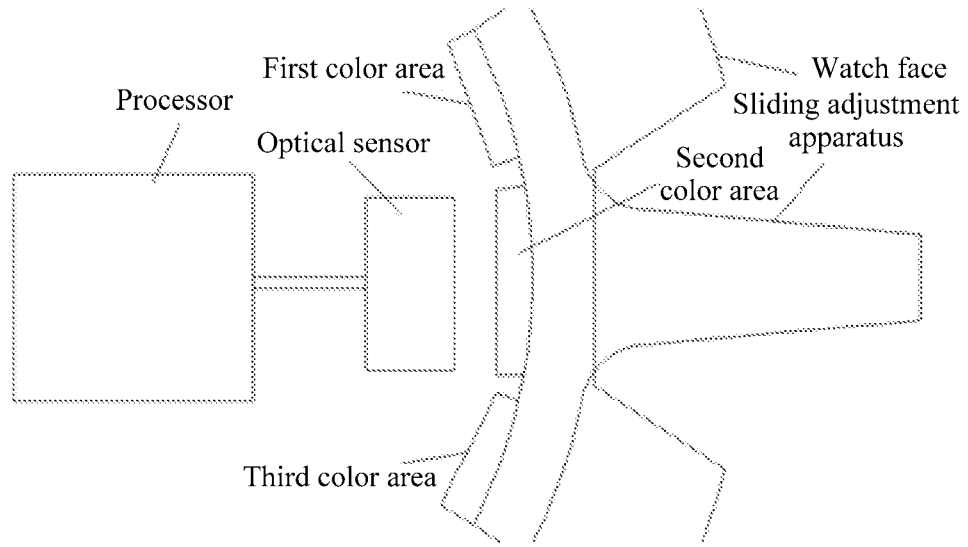
FIG. 13 is a smartwatch according to a specific embodiment of the present invention.

FIG. 13 is a smartwatch according to a specific embodiment of the present invention. As shown in FIG. 13, the smartwatch includes a watch face and a sliding adjustment apparatus, and the sliding adjustment apparatus is disposed on the watch face. Content displayed on the smartwatch is adjusted by sliding the sliding adjustment apparatus. The sliding adjustment apparatus includes a sliding piece and an optical sensor. The sliding piece includes a plurality of color areas, and the different color areas on the sliding piece are aligned with the optical sensor, so that the optical sensor outputs different signals. The watch face includes a processor and a display screen. The processor outputs different content based on the signals and displays the content on the display screen, so as to adjust the content displayed on the smartwatch.

In an example, a first color area, a second color area, and a third color area are adjacently disposed on the sliding piece. The second color area is aligned with the optical sensor in a normal case. When the sliding piece slides upward, the first color area is aligned with the optical sensor. When the sliding piece slides downward, the third color area is aligned with the optical sensor. When the first color area is aligned with the optical sensor, the optical sensor outputs a signal A. After receiving the signal A, the processor outputs a first control instruction. For example, the first control instruction is used to display, by using the display screen, next-page content of content that is currently displayed on the display screen. When the second color area is aligned with the optical sensor, the optical sensor outputs a signal B. After receiving the signal B, the processor outputs a second control instruction. For example, the second control instruction is used to display, by using the display screen, last-page content of content that is currently displayed on the display screen.

Figure 14:
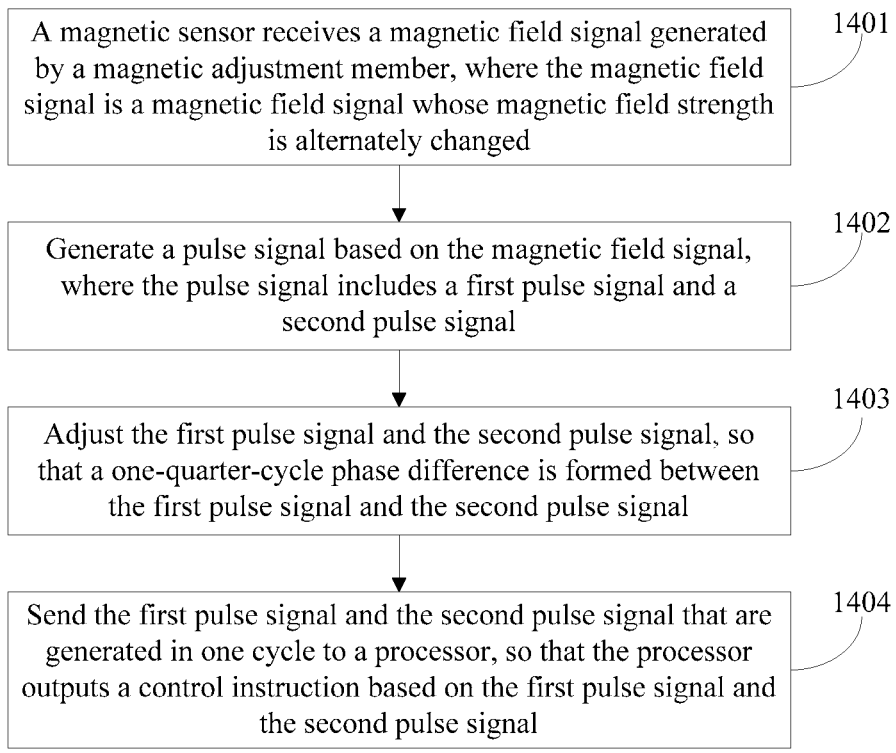
FIG. 14 is a mobile communication method according to a specific embodiment of the present invention.

FIG. 14 is a mobile communication method according to a specific embodiment of the present invention. As shown in FIG. 14, the method specifically includes the following steps:

1401. A magnetic sensor receives a magnetic field signal generated by a magnetic adjustment member, where the magnetic field signal is a magnetic field signal whose magnetic field strength is alternately changed.

1402. Generate a pulse signal based on the magnetic field signal, where the pulse signal includes a first pulse signal and a second pulse signal.

1403. Adjust the first pulse signal and the second pulse signal, so that a one-quarter-cycle phase difference is formed between the first pulse signal and the second pulse signal.

1404. Send the first pulse signal and the second pulse signal that are generated in one cycle to a processor, so that the processor outputs a control instruction based on the first pulse signal and the second pulse signal.

Figure 15:
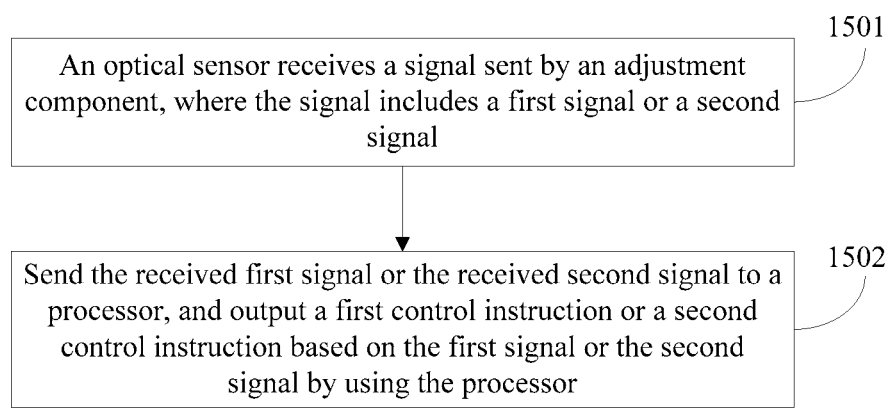
FIG. 15 is a mobile communication method according to a specific embodiment of the present invention.

FIG. 15 is a mobile communication method according to a specific embodiment of the present invention. As shown in FIG. 14, the method specifically includes the following steps:

1501. An optical sensor receives a signal sent by an adjustment component, where the signal includes a first signal or a second signal.

1502. Send the received first signal or the received second signal to a processor, and output a first control instruction or a second control instruction based on the first signal or the second signal by using the processor.

A person skilled in the art may be further aware that, in combination with the examples described in the embodiments disclosed in this specification, units and algorithm steps can be implemented by electronic hardware, computer software, or a combination thereof. To clearly describe the interchangeability between the hardware and the software, the foregoing has generally described compositions and steps of each example based on functions. Whether the functions are performed by using hardware or software depends on particular applications and design constraint conditions of the technical solutions. A person skilled in the art may use different methods to implement the described functions for each particular application, but it should not be considered that the implementation goes beyond the scope of the present invention.

Steps of methods or algorithms described in the embodiments disclosed in this specification may be implemented by using hardware, a software module executed by a processor, or a combination thereof. The software module may reside in a random access memory (RAM), a memory, a read-only memory (ROM), an electrically programmable ROM, an electrically erasable programmable ROM, a register, a hard disk, a removable disk, a CD-ROM, or any other form of storage medium known in the art.

In the foregoing specific implementations, the objective, technical solutions, and beneficial effects of the present invention are further described in detail. It should be understood that the foregoing descriptions are merely specific implementations of the present invention, but are not intended to limit the protection scope of the present invention. Any modification, equivalent replacement, or improvement made without departing from the principle of the present invention should fall within the protection scope of the present invention.

What is claimed is:

1. A smartwatch, comprising a device body and a magnetic adjustment mechanism, wherein the magnetic adjustment mechanism comprises a magnetic adjustment member and a magnetic sensor, and the magnetic adjustment member is adjusted to enable the magnetic sensor to generate a pulse signal; and the device body further comprises a processor and a display screen, and the processor receives the pulse signal generated by the magnetic adjustment mechanism, processes the pulse signal, and then displays adjusted content by using the display screen; and wherein the magnetic sensor comprises a first output part and a second output part, the first output part outputs a first pulse signal, the second output part outputs a second pulse signal, and a half phase difference is formed between the first pulse signal and the second pulse signal, wherein the magnetic adjustment member is a convex polygon-shaped magnetic ring, the magnetic ring comprises a plurality of magnetic sets, and each magnetic set consists of an S-pole magnetic piece whose polarity is "south pole" and an N-pole magnetic piece whose polarity is "north pole", and wherein each magnetic set forms one polygon side.

2. The smartwatch according to claim 1, wherein the magnetic ring further comprises a roller, and the plurality of magnetic sets are disposed on the roller.

3. The smartwatch according to claim 1, wherein that the magnetic adjustment member is adjusted to enable the magnetic sensor to generate a pulse signal specifically comprises:
  rotating the magnetic ring, so that a magnetic line generated by the magnetic ring passes through the magnetic sensor and the magnetic sensor generates the pulse signal.

4. An information processing method, wherein the method comprises:
  receiving, by a magnetic sensor, a magnetic field signal generated by a magnetic adjustment member, wherein the magnetic field signal is a magnetic field signal whose magnetic field strength is alternately changed;
  generating a pulse signal based on the magnetic field signal, wherein the pulse signal comprises a first pulse signal and a second pulse signal;
  adjusting the first pulse signal and the second pulse signal, so that a one-quarter-cycle phase difference is formed between the first pulse signal and the second pulse signal; and
  sending the first pulse signal generated in one cycle and the second pulse signal generated in the one cycle to a processor, so that the processor outputs a control instruction based on the first pulse signal in the one cycle and the second pulse signal in the one cycle, and
  wherein the magnetic field signal whose magnetic field strength is alternately changed is generated by rotating a convex polygon-shaped magnetic ring, the magnetic ring comprises a plurality of magnetic sets, and the magnetic set consists of an S-pole magnetic piece whose polarity is "south pole" and an N-pole magnetic piece whose polarity is "north pole".

5. The method according to claim 4, wherein the magnetic ring further comprises a roller, and the plurality of magnetic sets are disposed on the roller.

6. The method according to claim 4, wherein that the magnetic adjustment member is adjusted to enable the magnetic sensor to generate a pulse signal specifically comprises:
  rotating the magnetic ring, so that a magnetic line generated by the magnetic ring passes through the magnetic sensor and the magnetic sensor generates the pulse signal.

7. The method according to claim 4, wherein the magnetic sensor comprises a first output part and a second output part, the first output part outputs the first pulse signal, the second output part outputs the second pulse signal, and a half phase difference is formed between the first pulse signal and the second pulse signal.

* * * * *

UNITED STATES PATENT AND TRADEMARK OFFICE
CERTIFICATE OF CORRECTION

PATENT NO. : 11,467,227 B2
APPLICATION NO. : 16/322479
DATED : October 11, 2022
INVENTOR(S) : Duo Sun et al.

It is certified that error appears in the above-identified patent and that said Letters Patent is hereby corrected as shown below:

On the Title Page

Column 2, item (57), under ABSTRACT, please remove "disclose" and replace with "discloses" on the fourth word of the line.

Signed and Sealed this
Tenth Day of January, 2023

Katherine Kelly Vidal
*Director of the United States Patent and Trademark Office*